(12) United States Patent
Bae et al.

(10) Patent No.: US 9,991,374 B2
(45) Date of Patent: Jun. 5, 2018

(54) SEMICONDUCTOR DEVICE AND METHOD FOR MANUFACTURING THE SAME

(71) Applicant: ELECTRONICS AND TELECOMMUNICATIONS RESEARCH INSTITUTE, Daejeon (KR)

(72) Inventors: Sung-Bum Bae, Daejeon (KR); Sung Bock Kim, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days. days.

(21) Appl. No.: 15/591,643

(22) Filed: May 10, 2017

(65) Prior Publication Data

US 2018/0033879 A1 Feb. 1, 2018

(30) Foreign Application Priority Data

Jul. 27, 2016 (KR) ........................ 10-2016-0095728

(51) Int. Cl.
*H01L 21/48* (2006.01)
*H01L 29/778* (2006.01)
*H01L 29/20* (2006.01)
*H01L 29/66* (2006.01)

(52) U.S. Cl.
CPC ...... *H01L 29/7787* (2013.01); *H01L 29/2003* (2013.01); *H01L 29/66462* (2013.01)

(58) Field of Classification Search
CPC ............. H01L 29/7787; H01L 29/2003; H01L 29/66462; H01L 41/331; H01L 21/7806; H01L 21/7813; H01L 21/78
See application file for complete search history.

(56) References Cited

U.S. PATENT DOCUMENTS

| | | |
|---|---|---|
| 2013/0020649 A1 | 1/2013 | Bae et al. |
| 2014/0220764 A1 | 8/2014 | Bayram et al. |
| 2015/0179428 A1 | 6/2015 | Bayram et al. |
| 2015/0187886 A1 | 7/2015 | Park et al. |
| 2016/0197227 A1 | 7/2016 | Forrest et al. |

FOREIGN PATENT DOCUMENTS

| | | |
|---|---|---|
| KR | 10-2011-0111209 A | 10/2011 |
| KR | 10-2016-0048142 A | 5/2016 |

OTHER PUBLICATIONS

S. W. Bedell et al., "Cost-Effective Layer Transfer by Controlled Spalling Technology", ECS Transactions, 50 (7) 315-323, 2012.

*Primary Examiner* — Elias M Ullah
(74) *Attorney, Agent, or Firm* — Rabin & Berdo, P.C.

(57) ABSTRACT

A method for manufacturing a semiconductor device includes sequentially stacking a first epitaxial layer, a sacrificial layer, a second epitaxial layer, and a third epitaxial layer on a first substrate, forming a trench which penetrates the third epitaxial layer, the second epitaxial layer, and the sacrificial layer, forming a structure layer on an upper surface of the third epitaxial layer, forming a metal film which covers an inner surface of the trench and the structure layer, forming a second substrate which fills the trench and covers the metal film, and separating the second epitaxial layer, the third epitaxial layer, and the structure layer from the first epitaxial layer.

9 Claims, 9 Drawing Sheets

SEMICONDUCTOR DEVICE AND METHOD FOR MANUFACTURING THE SAME

CROSS-REFERENCE TO RELATED APPLICATIONS

This U.S. non-provisional patent application claims priority under 35 U.S.C. § 119 to Korean Patent Application No. 10-2016-0095728, filed on Jul. 27, 2016 in the Korean Intellectual Properly Office, the entire contents of which are hereby incorporated by reference.

BACKGROUND

1. Technical Field

The present disclosure herein relates to a semiconductor device and a method for manufacturing the same, and more particularly, to a nitride-based semiconductor device and a method for manufacturing the same.

2. Background Information

A nitride of a group 3 element, i.e., GaN-based compound semiconductor has a wide bandgap in comparison with a typical Si or compound semiconductor. A nitride semiconductor, which is a direct-transition-type semiconductor, enables control of wavelengths of light from visible rays to ultraviolet rays. Furthermore, compared to typical compound semiconductors, a nitride semiconductor has excellent properties such as high thermal/chemical stability, high electron mobility, high saturated electron velocity, and large energy bandgap. Due to such properties, nitride semiconductors are widely applied to the fields in which the use of typical compound semiconductors is limited. For example, nitride semiconductors are applied to optical devices such as light-emitting diodes (LEDs) and laser diodes (LDs) and electronic devices for use in next-generation wireless communication or satellite communication systems required to have high power and high frequency characteristics.

In general, semiconductor devices are manufactured on expensive single-crystal growth substrates. Such growth substrates may include a single-crystal wafer which may be used to form a structure support and a compete lattice for epitaxial growth of a semiconductor layer such as an active layer. In the case of a nitride semiconductor device, since there is no lattice-constant-matched substrate, a sapphire substrate is commonly used, but a low thermal conductivity of this substrate causes degradation of the performance of a device. Therefore, researches are being carried out with respect to transporting a device to a host substrate having desirable optical characteristics, mechanical characteristics, or thermal characteristics. In particular, in the case of removing a sapphire substrate, since a device should be separated from a single-crystal substrate, expensive processing equipment such as laser lift-off (LLO) equipment is required, or the yield is degraded due to the complexity of a substrate separating process.

SUMMARY

Embodiments of the present disclosure provide a semiconductor device manufacturing method enabling partial spalling.

Embodiments of the present disclosure also provide a semiconductor device manufacturing method enabling adjustment of a thickness of a semiconductor layer to be separated from a substrate.

According to exemplary embodiments of the present disclosure, a method for manufacturing a semiconductor device include: sequentially stacking a first epitaxial layer, a sacrificial layer, a second epitaxial layer, and a third epitaxial layer on a first substrate; forming a trench which penetrates the third epitaxial layer, the second epitaxial layer, and the sacrificial layer; forming a structure layer on an upper surface of the third epitaxial layer; forming a metal film which covers an inner surface of the trench and the structure layer; forming a second substrate which fills the trench and covers the metal film; and separating the second epitaxial layer, the third epitaxial layer, and the structure layer from the first epitaxial layer.

In an embodiment, the separating the second epitaxial layer, the third epitaxial layer, and the structure layer may include: providing a stress to the sacrificial layer; and separating the second epitaxial layer from the first epitaxial layer. Propagation of a crack may start, due to the stress, at one end of the sacrificial layer which contacts the metal film. The crack may progress along the sacrificial layer.

In an embodiment, the trench may be provided in plurality. Device parts may be defined by the trenches. Each trench may include a part of the second epitaxial layer, a part of the third epitaxial layer, and a part of the structure layer.

In an embodiment, during a process of separating the second epitaxial layer, the third epitaxial layer, and the structure layer, only a portion of the device parts may be separated.

In an embodiment, the sacrificial layer may have a lattice constant different from lattice constants of the first epitaxial layer and the second epitaxial layer, wherein the sacrificial layer may have lattice matching with the first epitaxial layer and the second epitaxial layer at interfaces with the first epitaxial layer and the second epitaxial layer.

In an embodiment, the sacrificial layer may include $In_{0.17}Al_{0.83}N$. The first and second epitaxial layers may include gallium nitride (GaN).

In an embodiment, a bottom surface of the trench may have a width larger than that of an upper end of the trench.

In an embodiment, the trench may increase in width in a direction from the third epitaxial layer to the sacrificial layer.

In an embodiment, the metal film may cover a sidewall and a bottom surface of the trench. The second substrate may be spaced apart from the sidewall and the bottom surface of the trench.

According to exemplary embodiments of the present disclosure, a semiconductor device includes: a first semiconductor layer; a second semiconductor layer disposed on the first semiconductor layer; a structure layer disposed on the second semiconductor layer; a metal film covering a side surface of the first semiconductor layer, a side surface of the second semiconductor layer, and an upper surface of the structure layer; and a flexible substrate covering the metal film.

In an embodiment, a width of the first semiconductor layer may be smaller than a width of the second semiconductor layer. The width of the second semiconductor layer may be smaller than a width of the structure layer.

In an embodiment, side surfaces of the first semiconductor layer, the second semiconductor layer, and the structure layer may form a shape tapered in a direction from the structure layer to the first semiconductor layer.

In an embodiment, the structure layer may include: source/drain electrodes arranged on an upper surface of the second semiconductor layer; a gate electrode disposed on the second semiconductor layer, the gate electrode spaced apart from the source/drain electrodes; and a protective layer covering the source/drain electrodes and the gate electrode.

BRIEF DESCRIPTION OF THE FIGURES

The accompanying drawings are included to provide a further understanding of the disclosure, and are incorporated in and constitute a part of this specification. The drawings illustrate exemplary embodiments of the disclosure and, together with the description, serve to explain principles of the disclosure. In the drawings.

DETAILED DESCRIPTION

Figure 1:
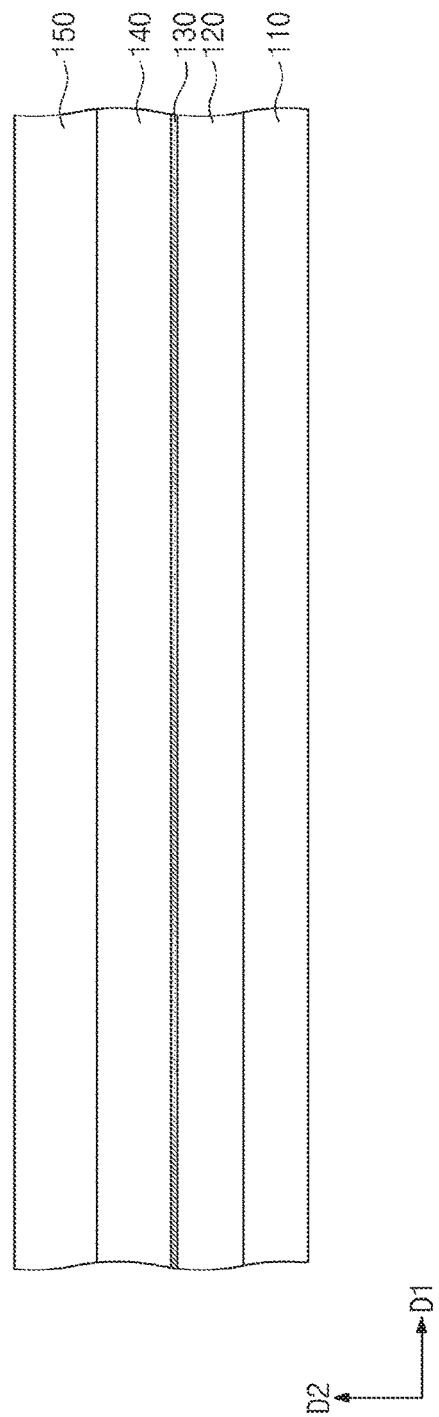
FIGS. 1 to 7 are cross-sectional views illustrating a method for manufacturing a semiconductor device according to embodiments of the disclosure.

Exemplary embodiments of the inventive concepts will be described below in more detail with reference to the accompanying drawings. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. Those skilled in the art would understand that embodiments of the inventive concepts can be carried out in a certain appropriate environment.

The terminology used herein is not for delimiting the embodiments of the inventive concepts but for describing the embodiments. The terms of a singular form may include plural forms unless otherwise specified. It will be further understood that the terms "includes", "including", "comprises", and/or "comprising", when used in this specification, specify the presence of stated elements, steps, operations, and/or components, but do not preclude the presence or addition of one or more other elements, steps, operations, components, and/or groups thereof.

In this description, when a film (or layer) is referred to as being on another film (or layer), it can be directly on the other film (or layer), or intervening films (or layers) may also be present therebetween.

It will be understood that, although the terms "first", "second", "third", etc. may be used herein to describe various regions, films (or layers), etc., these regions or films should not be limited by these terms. These terms are only used to distinguish one region or film (or layer) from another region or film (or layer). Therefore, a film material referred to as a first film material in an embodiment may be referred to as a second film material in another embodiment. The embodiments exemplified and described herein include complementary embodiments thereof. Like reference numerals refer to like elements throughout.

The terms used to describe the embodiments of the inventive concepts may be interpreted as the meanings known in the art unless the terms are defined differently.

FIGS. 1 to 7 are cross-sectional views illustrating a method for manufacturing a semiconductor device according to embodiments of the disclosure.

Referring to FIG. 1, a first substrate 110 may be provided. The first substrate 110 may have an upper surface and a lower surface opposing the upper surface. The first substrate 110 may be a high resistance substrate having an insulating characteristic. For example, the first substrate 110 may be a sapphire ($Al_2O_3$) substrate. Alternatively, the first substrate 110 may include a silicon (Si) substrate or a silicon carbide (SiC) substrate.

A first epitaxial layer 120 may be formed on the upper surface of the first substrate 110. The first epitaxial layer 120 may include gallium nitride (GaN). The first epitaxial layer 120 may be formed by an epitaxial growth process. The epitaxial growth process for forming the first epitaxial layer 120 may include at least one of metal organic chemical vapor deposition, liquid phase epitaxy, hydride vapor phase epitaxy, molecular beam epitaxy, or metal organic vapor phase epitaxy (MOVPE). A thickness of the first epitaxial layer 120 may be from about 0.5 µm to about 3 µm.

Although not illustrated, a buffer layer (not shown) or a laminate structure of a buffer layer (not shown) and a relaxation layer (not shown) may be further formed between the first substrate 110 and the first epitaxial layer 120. The buffer layer (not shown) may include AlGaN or AlGaN/AlN, and the relaxation layer (not shown) may include GaN or AlN. The buffer layer (not shown) may be provided to overcome limitations (e.g., occurrence of a crack or defect) caused by a difference of a thermal expansion coefficient or lattice mismatching between the first substrate 110 and the first epitaxial layer 120, and the relaxation layer (not shown) may be provided to reduce stress of the first epitaxial layer 120.

A sacrificial layer 130 may be formed on the first epitaxial layer 120. The sacrificial layer 130 may be formed by an epitaxial growth process. After a process for forming the first epitaxial layer 120 is finished, a process for forming the sacrificial layer 130 may follow the process for forming the first epitaxial layer 120. The sacrificial layer 130 may have a thickness of about 5 nm to about 20 nm. According to another embodiment of the disclosure, the sacrificial layer 130 may be a mono molecular layer.

A second epitaxial layer 140 may be formed on the sacrificial layer 130. The second epitaxial layer 140 may be formed by an epitaxial growth process. A process for forming the second epitaxial layer 140 may successively follow the process for forming the sacrificial layer 130. The second epitaxial layer 140 may be formed of the same material as the first epitaxial layer 120. The second epitaxial layer 140 may include gallium nitride (GaN).

According to embodiments of the disclosure, the sacrificial layer 130 disposed between the first epitaxial layer 120 and the second epitaxial layer 140 may include a stress embedded layer (SEL) within a lattice structure of the sacrificial layer 130. In detail, the sacrificial layer 130 may have a lattice constant different from lattice constants of the first epitaxial layer 120 and the second epitaxial layer 140. For example, in the case where the first epitaxial layer 120 and the second epitaxial layer 140 are formed of gallium nitride (GaN), the sacrificial layer 130 may include $In_{0.17}Al_{0.83}N$. Here, since the sacrificial layer 130 is formed on the first epitaxial layer 120 through an epitaxial growth process, the sacrificial layer 130 may be lattice-matched to the first epitaxial layer 120 at an interface with the first epitaxial layer 120. That is, a crystal structure of the sacrificial layer 130 may be distorted to a higher degree in a direction from an inner part of the sacrificial layer 130 to the interface with the first epitaxial layer 120. In addition, since the second epitaxial layer 140 is formed on the sacrificial layer 130 through an epitaxial growth process, the sacrificial layer 130 may be lattice-matched to the second epitaxial layer 140 at an interface with the second epitaxial layer 140. That is, the crystal structure of the sacrificial layer 130 may be distorted to a higher degree in a direction from the inner part of the sacrificial layer 130 to the interface with the second epitaxial layer 140. Accordingly, the sacrificial layer 130 may have a stress within the lattice structure thereof.

A third epitaxial layer 150 may be formed on the second epitaxial layer 140. The third epitaxial layer 150 may be formed by an epitaxial growth process. A process for forming the third epitaxial layer 150 may successively follow the process for forming the second epitaxial layer 140. The third epitaxial layer 150 may include AlGaN, InAlN, or InAlGaN.

An interface between the second epitaxial layer 140 and the third epitaxial layer 150 may be used as a channel region. In detail, when the second epitaxial layer 140 and the third epitaxial layer 150 form a heterojunction structure (AlGaN/GaN, InAlN/GaN, or InAlGaN/GaN), a 2-dimensional electron gas (2-DEG) region may be formed due to a bandgap mismatch at the interface between the second epitaxial layer 140 and the third epitaxial layer 150. In the 2-DEG region, electrons may freely move only in a first direction D1 parallel with a heterojunction surface, so that the 2-DEG region may serve as a channel region in the semiconductor device. Here, the first direction D1 is parallel with an upper surface of the first epitaxial layer 120, and a second direction D2 may be defined as a perpendicular direction to the upper surface of the first epitaxial layer 120.

Figure 2:
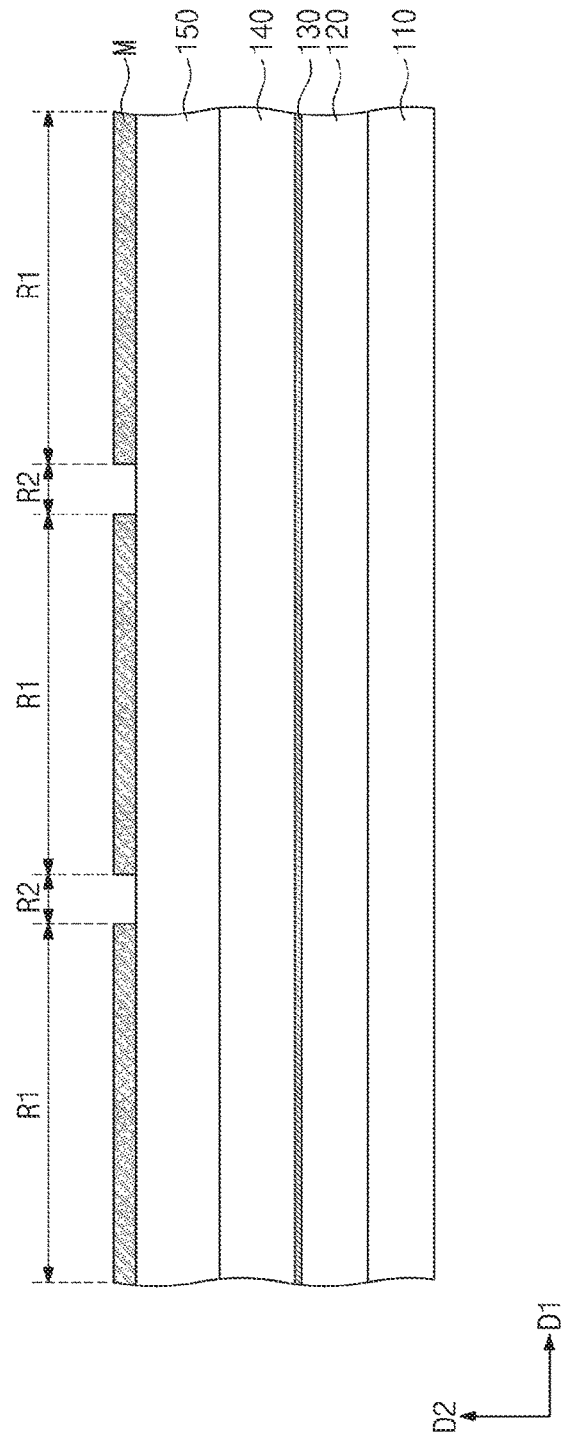

Referring to FIG. 2, a mask film M may be formed on the third epitaxial layer 150. The first substrate 110 may have first regions R1 and second regions R2. The second regions R2 may be provided between the first regions R1. Each first region R1 may have a width of about 5 μm to about 10 μm. The mask film M may cover a part of the third epitaxial layer 150 on the first regions R1 of the first substrate 110, and may expose another part of the third epitaxial layer 150 on the second regions R2 of the first substrate 110. The mask film M may include a photoresist film.

Figure 3:
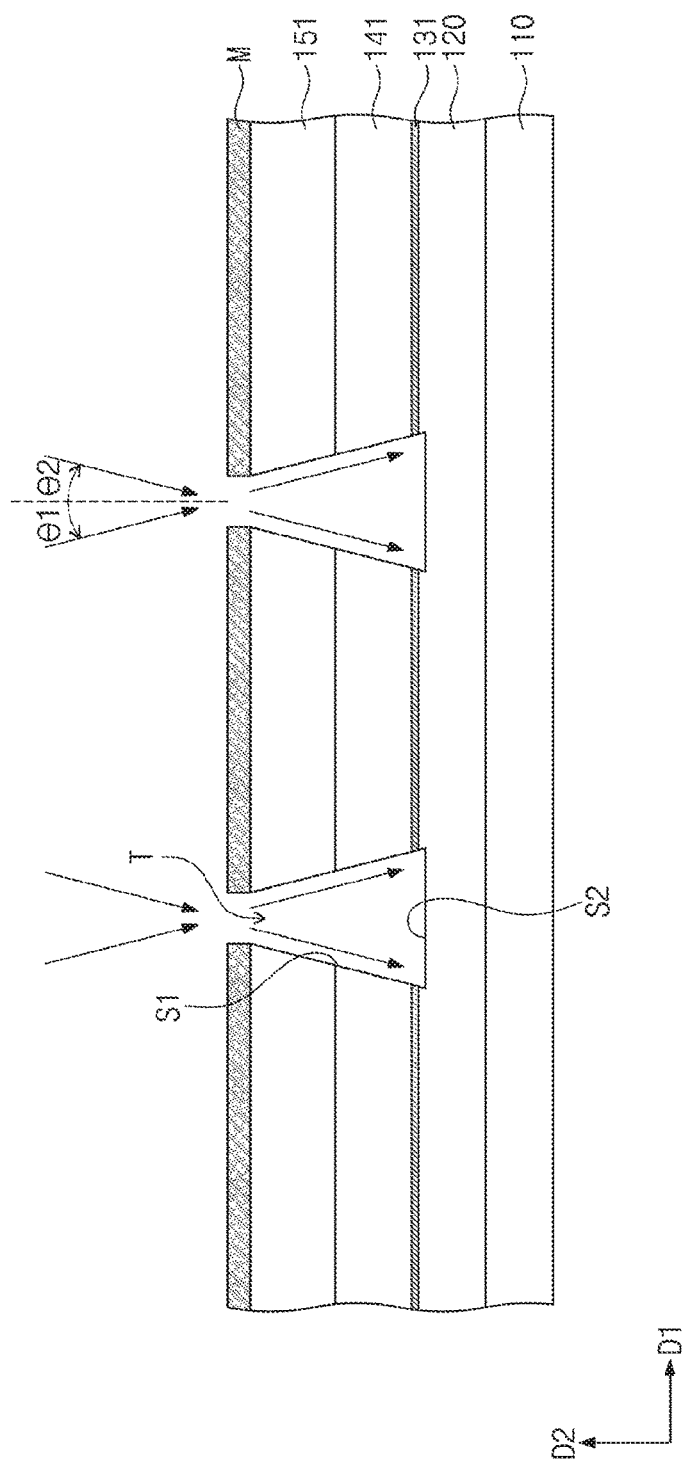

Referring to FIG. 3, a trench T may be formed in the third epitaxial layer 150. In detail, the trench T may be formed by performing an etching process on the third epitaxial layer 150 using the mask film M as an etching mask. Here, the trench T may penetrate the third epitaxial layer 150, the second epitaxial layer 140, and the sacrificial layer 130. That is, a bottom surface S2 of the trench T may expose the first epitaxial layer 120. Through the etching process, second semiconductor layers 151, first semiconductor layers 141, and unit sacrificial layers 131 may be formed from the third epitaxial layer 150, the second epitaxial layer 140, and the sacrificial layer 130 respectively by the trench T. The unit sacrificial layers 131 may be arranged on the first region R1 respectively, and the first semiconductor layers 141 may be arranged on the first regions R1 respectively. Upper surfaces of the second semiconductor layers 151 may have a width of about 5 μm to about 10 μm. Thereafter, the mask film M may be removed.

According to an embodiment of the disclosure, a lower end of the trench T may have a larger width than that of an upper end of the trench T. In detail, the width of the bottom surface S2 of the trench T may be larger than the width of the trench T at the upper surfaces of the second semiconductor layer 151. For example, as illustrated in FIG. 3, the trench T may be shaped like a reverse mesa of which an inner surface is tapered. That is, the width of the trench T may increase in a direction from the second semiconductor layers 151 to the unit sacrificial layers 131. As indicated by the arrows in FIG. 3, the second semiconductor layers 151 may be formed by etching the third epitaxial layer 150 in a direction inclined with respect to an upper surface of the third epitaxial layer 150. For example, the third epitaxial layer 150 may be etched at a first angle θ1 with respect to the second direction D2. The third epitaxial layer 150 may be further etched at a second angle θ1 which is symmetrical to the first angle θ1 with respect to the second direction D2. As a result, the trench T may be formed in the shape of a reverse mesa. Although FIG. 3 illustrates the trench T having a reverse mesa structure, an embodiment of the disclosure is not limited thereto. According to other embodiments of the disclosure, the lower end of the trench T may have the same width as the upper end of the trench T.

Figure 4:
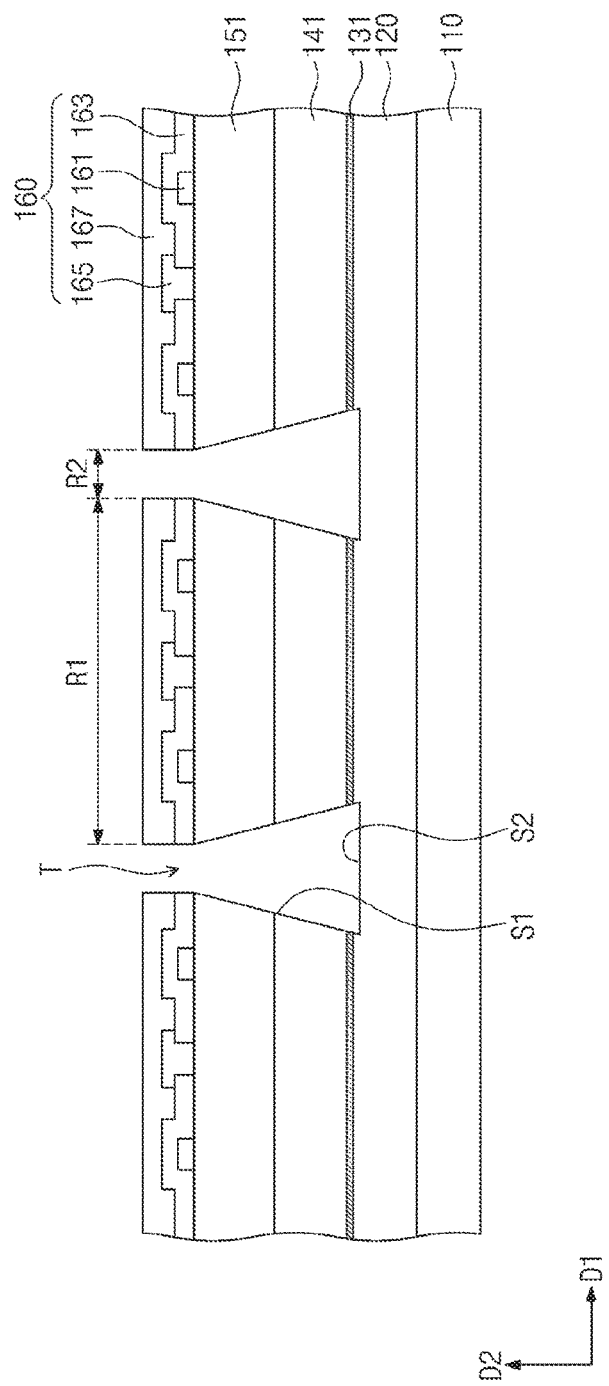

Referring to FIG. 4, structure layers 160 may be formed on the upper surfaces of the second semiconductor layers 151. According to an embodiment of the disclosure, the structure layers 160 may form transistors together with the first semiconductor layers 141 and the second semiconductor layers 151. For example, each structure layer 160 may include source/drain electrodes 161, a gate electrode 165, and a protective layer 167 formed on one second semiconductor layer 151.

The source/drain electrodes 161 may be formed by depositing metal on the upper surfaces of the second semiconductor layers 151 and then by patterning the metal. While the patterning is performed, a part of the metal deposited within the trench T may be removed. The source/drain electrodes 161 may be spaced apart from each other. The source/drain electrodes 161 may be metal electrodes. For example, the source/drain electrodes 161 may include aluminum (Al) or titanium (Ti). According to an embodiment of the disclosure, the source/drain electrodes 161 may be ohmic contacted on the second semiconductor layers 151 through a heat treatment process.

An insulating layer 163 may be formed on the second semiconductor layers 151. The insulating layer 163 may be formed by applying a dielectric film on the second semiconductor layers 151. For example, the dielectric film may include silicon nitride (SiN) or silicon oxide (SiO). Thereafter, a part of the dielectric film deposited within the trench T may be removed by patterning the dielectric film. That is, the insulating layer 163 may cover the upper surfaces of the second semiconductor layers 151 and the source/drain electrodes 161.

The gate electrode 165 may be formed on the insulating layer 163. For example, the upper surfaces of the second semiconductor layers 151 may be exposed by etching the insulating layer 163. Metal may be applied onto the exposed upper surfaces of the second semiconductor layers 151. Thereafter, the gate electrode 165 may be formed by patterning a metal layer. While the patterning is performed, a part of the metal deposited within the trench T may be removed. Here, the gate electrode 165 is disposed between the source/drain electrodes 161, and may contact the upper surfaces of the second semiconductor layers 151. According to an embodiment of the disclosure, the gate electrode 165 may be schottky contacted on the second semiconductor layers 151 through a heat treatment process. The gate electrode 165 may be spaced apart from the source/drain electrodes 161. The gate electrode 165 may include metal. For example, the gate electrode 165 may include Ni/Au or Pt/Au.

The protective layer 167 may be formed on the insulating layer 163. The protective layer 167 may be formed by applying a dielectric film on the insulating layer 163. For example, the dielectric film may include silicon nitride (SiN) or silicon oxide (SiO). Thereafter, a part of the dielectric film deposited within the trench T may be removed by patterning the dielectric film. The protective layer 167 may cover an upper surface of the insulating layer 163, the source/drain electrodes 161, and the gate electrode 165.

Figure 5:
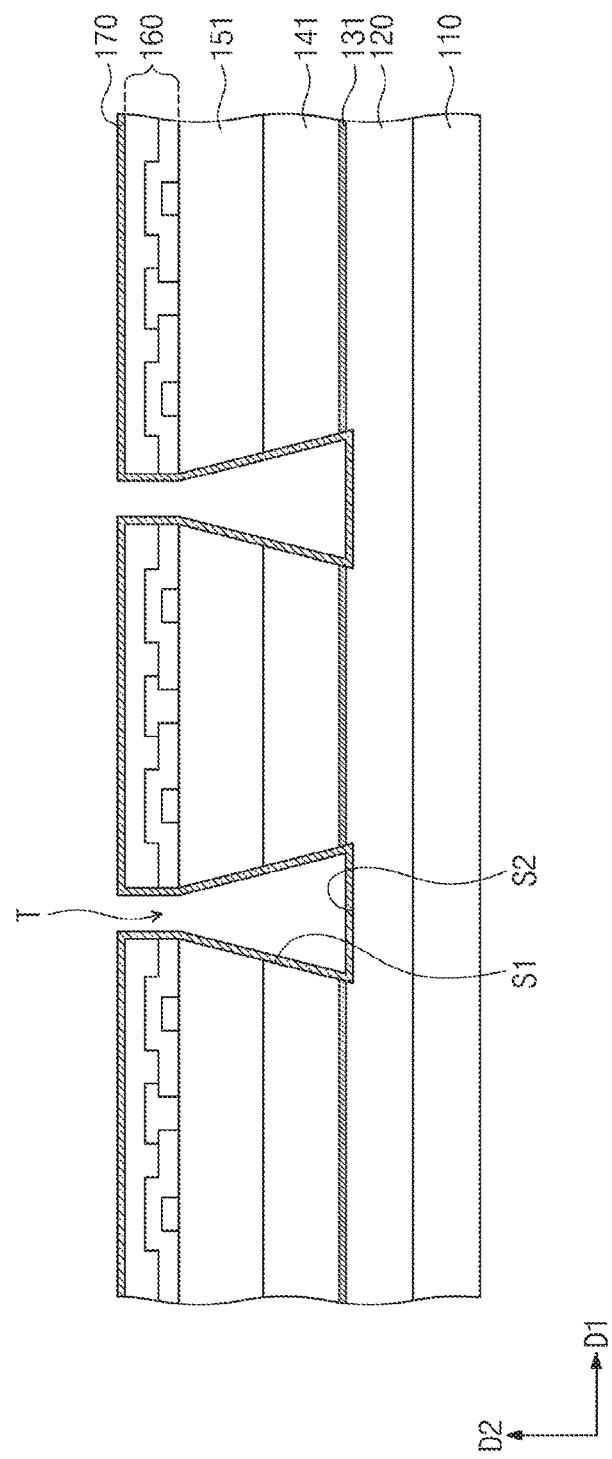

Referring to FIG. 5, a metal film 170 may be formed on the structure layers 160. The metal film 170 may include nickel (Ni) or gold (Au). This metal film 170 may be formed by an atomic layer deposition (ALD) process or a sputtering process. The metal film 170 may cover the upper surfaces of the structure layers 160 and the inner surface of the trench T. For example, the metal film 170 may cover a sidewall Si and the bottom surface S2 of the trench T. The metal film 170 may be deposited to a thickness of about 100 nm to about 200 nm. According to another embodiment of the disclosure, the metal film 170 may expose the bottom surface S2 of the trench T instead of covering the bottom surface S2. To this end, an additional process for patterning the metal film 170 may be performed after forming the metal film 170.

Although not illustrated, the metal film 170 may be used as a wiring after undergoing an additional process. For example, holes which expose the source/drain electrodes 161 and the gate electrode 165 respectively may be formed in the protective layer 167. The metal film 170 may extend into the holes to contact the source/drain electrodes 161 and the gate electrode 165.

Figure 6:
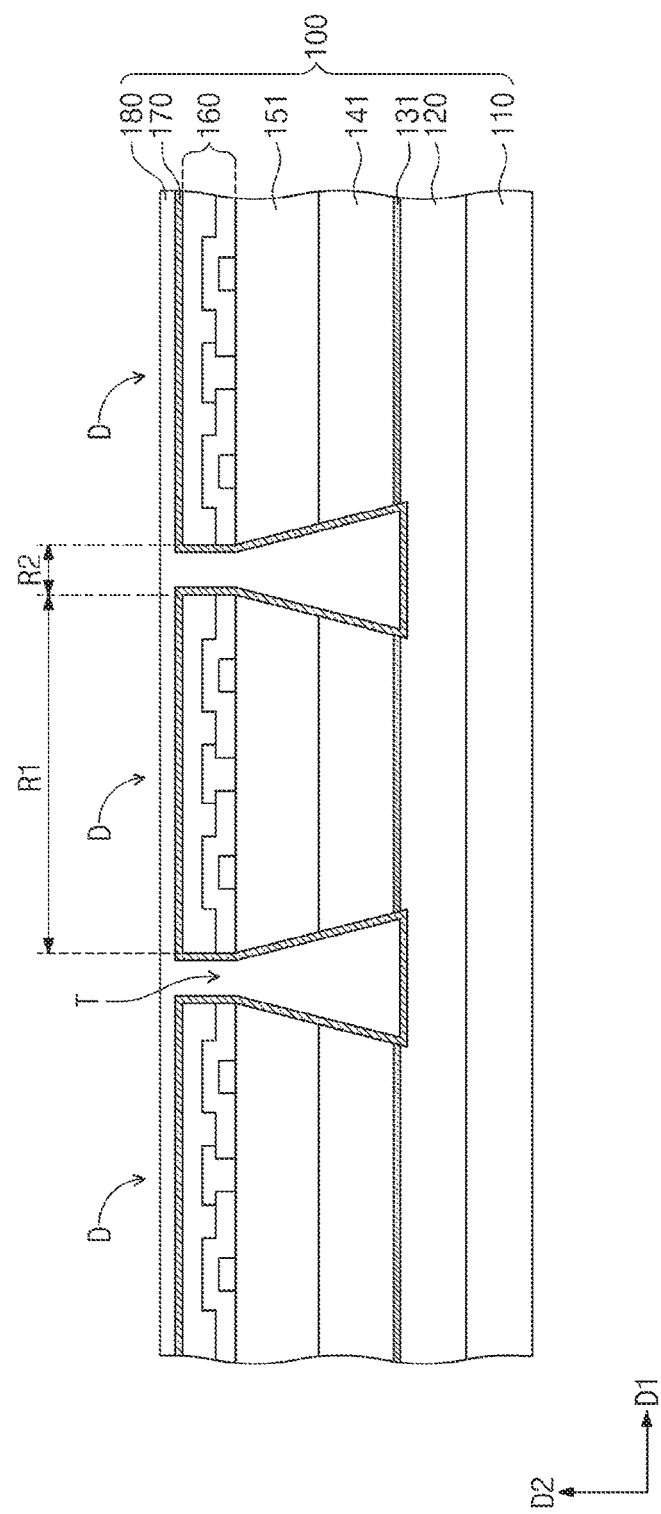

Referring to FIG. 6, a second substrate 180 may be formed on the metal film 170. The second substrate 180 may be a flexible substrate. For example, the second substrate 180 may include polyimide (PI), polyethylene terephthalate (PET), or polyethylene naphthalate (PEN). This second substrate 180 may be formed through application and hardening of the forgoing materials. Here, the second substrate 180 may cover the metal film 170 and may fill the trench T. That is, the second substrate 180 may contact the metal film 170, and may be spaced apart from the sidewall Si and the bottom surface S2 of the trench T. According to another embodiment of the disclosure, in the case where the metal film 170 exposes the bottom surface S2 of the trench T, the second substrate 180 may physically contact the bottom surface S2 of the trench T.

Device parts D may be defined on the first regions R1. The device parts D may include the first semiconductor layers 141, the second semiconductor layers 151, the structure layers 160, the metal film 170, and a part of the second substrate 180 formed in a single first region R1. In detail, a single device part D may include the first semiconductor layer 141, the second semiconductor layer 151, and the structure layer 160 sequentially stacked, and may further include the metal film 170 covering a side surface of the first semiconductor layer 141, a side surface of the second semiconductor layer 151, and the upper surface of the structure layer 160 and the second substrate 180 covering the metal film 170. Here, the width of the first semiconductor layers 141 may be smaller than the width of the second semiconductor layers 151, and the width of the second semiconductor layers 151 may be smaller than the width of the structure layers 160. For example, the side surfaces of the first semiconductor layers 141, the second semiconductor layers 151, and the structure layers 160 may form a shape tapered in an opposite direction of the first direction D2 (i.e., a direction from the structure layers 160 to the first semiconductor layer 141). The device parts D may be spaced apart from each other with the trench T therebetween.

Figure 7:
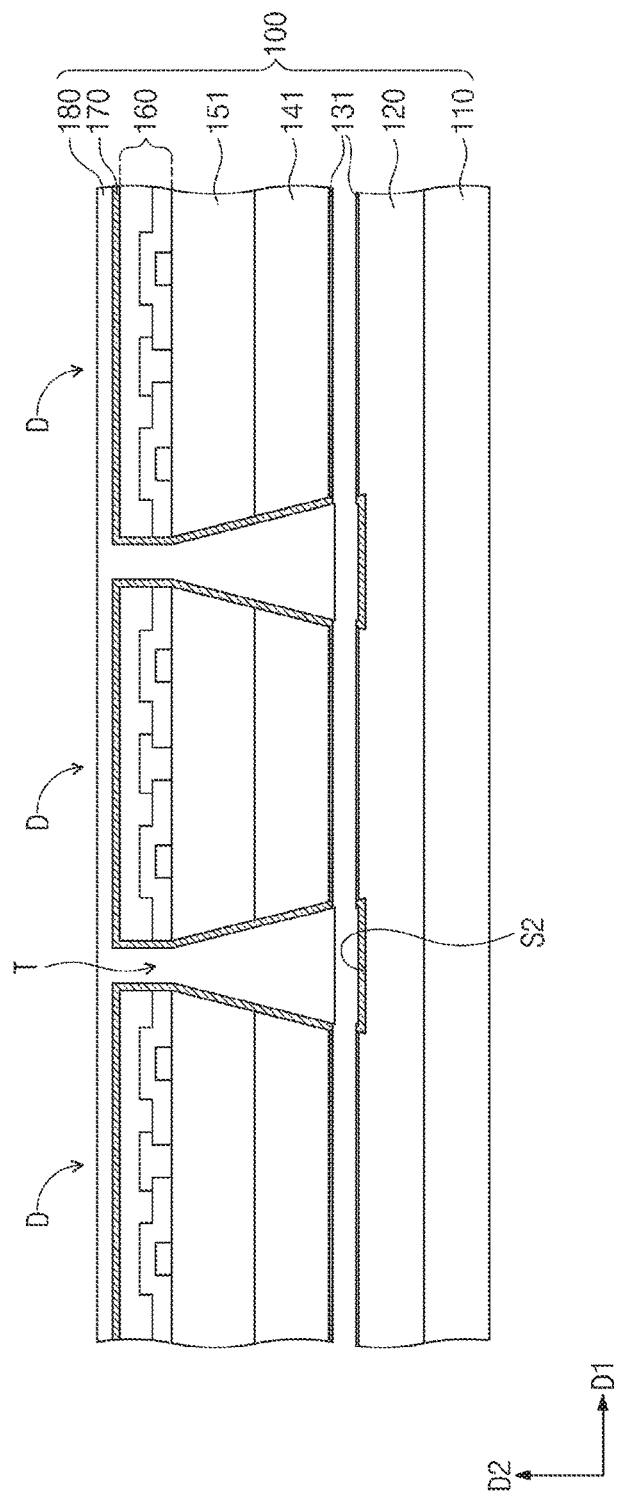

Referring to FIG. 7, the device parts D may be separated from the first epitaxial layer 120. A process for separating the device parts D may include a spalling process. Here, the spalling process represents a process in which a crack is induced using a difference in stress applied to stacked layers, and upper layers are exfoliated. Separation of the devices parts D is described in detail below.

A stress may be provided to a structure 100. Here, the structure 100 represents a laminate structure in which the foregoing elements from the first substrate 110 to the second substrate 180 are formed. The stress applied to the structure 100 may include tensile stress. The stress may be provided to the structure 100 using various methods, for example, directly applying a physical force to the structure 100 or forming a stressor on the second substrate 180.

As the stress is applied to the structure 100, crack propagation may start in the unit sacrificial layers 131. In detail, the unit sacrificial layers 131 may have lattice mismatching with the first epitaxial layer 120 and the first semiconductor layers 141 in the second direction D2. Due to this lattice mismatching, the unit sacrificial layers 131 may be vulnerable to stress. Compared to the unit sacrificial layers 131, the metal film 170 may be resistant to stress. As a result, when the stress is provided to the structure 100, a crack may occur in each one end of the unit sacrificial layers 131 which contacts the metal film 170. The metal film 170 may strongly adhere to the first epitaxial layer 120. The first epitaxial layer 120 of the second region R2 may contact the metal film 170. Even though the stress is applied to the structure 100, a crack may not occur between the metal film 170 and the first epitaxial layer 120 of the second region R2.

Thereafter, the device parts D may be separated from the first epitaxial layer 120 through a spalling process. The spalling process may be performed by means of crack propagation along the unit sacrificial layers 131. The crack may propagate along the insides of the unit sacrificial layers 131, interfaces between the unit sacrificial layers 131 and the first epitaxial layer 120, or interfaces between the unit sacrificial layers 131 and the first semiconductor layers 141. Along a propagation path of the crack, the unit sacrificial layers 131 may remain on the upper surface of the first epitaxial layer 120 and lower surfaces of the first semiconductor layers 141. For another example, the unit sacrificial layers 131 may not remain on the upper surface of the first epitaxial layer 120. For another example, the unit sacrificial layers 131 may not remain on the lower surfaces of the first semiconductor layers 141. Alternatively, in the case where the unit sacrificial layers 131 are formed as mono molecular layers, the unit sacrificial layers 131 may remain on neither the upper surface of the first epitaxial layer 120 nor the lower surfaces of the first semiconductor layers 141. According to an embodiment of the disclosure, a part of the metal film 170 may be cut together. For example, a part of the metal film 170 which contacts the bottom surface S2 of the trench T may be separated from the metal film 170 and may remain on the upper surface of the first epitaxial layer 120.

The structure 100 formed using the semiconductor device manufacturing method according to an embodiment of the disclosure may include the sacrificial layer 130 which defines a crack propagation path. That is, a plane in which exfoliation is to be induced during the spalling process may be determined using the sacrificial layer 130, which indicates that a thickness of the device parts D to be exfoliated may be adjusted. Therefore, the semiconductor device manufacturing method according to an embodiment of the disclosure may be advantageous for making a device thin.

In addition, since the unit sacrificial layers 131 is vulnerable to stress compared to the metal film 170 surrounding the device part D, a level of stress required for the spalling process may be low. Therefore, even though the spalling process is performed after forming the device parts D, the device parts D may not be damaged.

Figure 8:
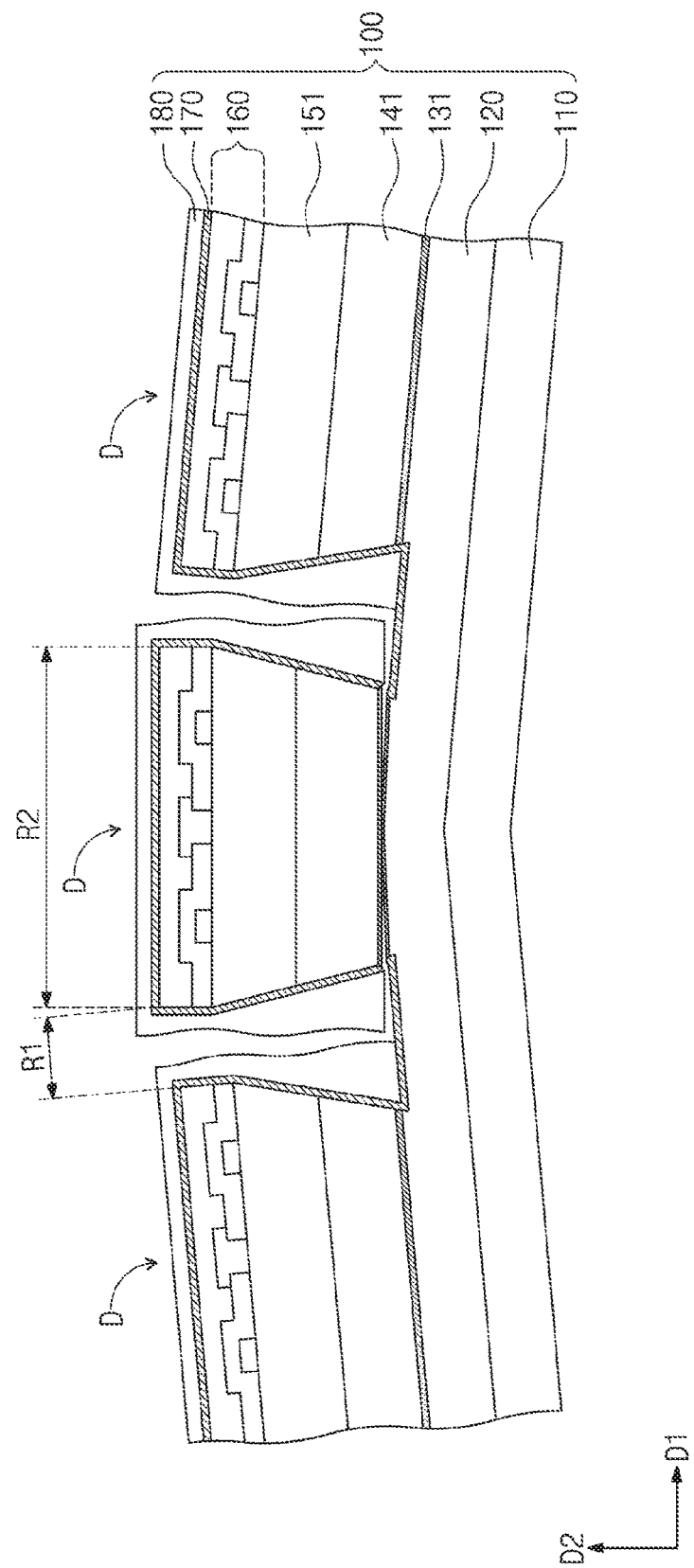
FIGS. 8 and 9 are cross-sectional views illustrating a method for manufacturing a semiconductor device according to other embodiments of the disclosure.
Figure 9:
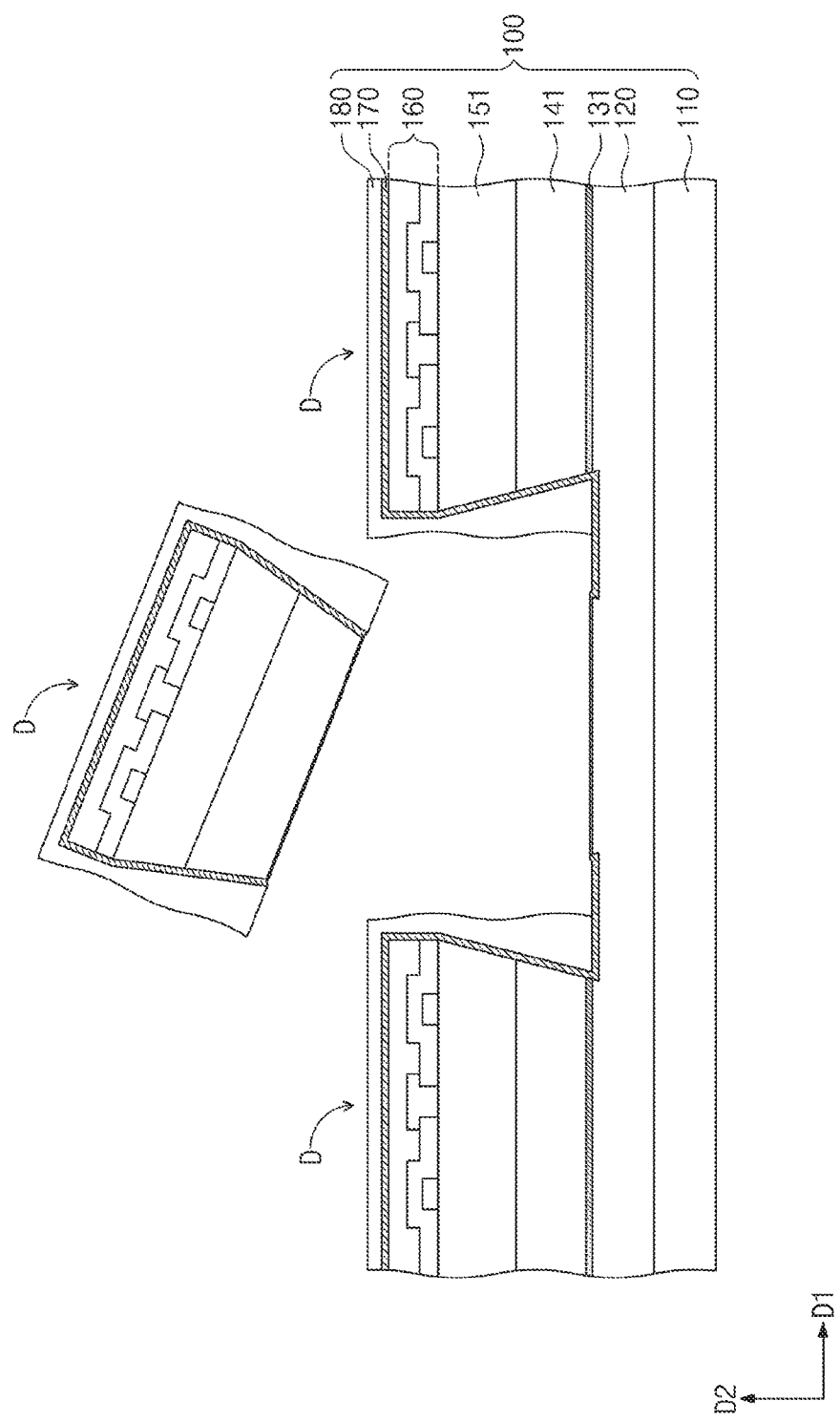

According to another embodiment of the disclosure, any one of the device parts alone may be separated during the spalling process. FIGS. 8 and 9 are cross-sectional views illustrating a method for manufacturing a semiconductor device according to other embodiments of the disclosure.

A stress may be strongly applied to a part of the structure 100. For example, as illustrated in FIG. 8, the stress may be applied to any one of the first regions R1 of the substrate 110 and the second regions R2 adjacent thereto. The stress may be delivered to the second substrate 180 and the metal film 170 positioned at locations corresponding to the second regions R2 to which the stress is applied. The second substrate 180 may have a lower strength than that of the metal film 170. The level of the applied stress may be higher than the strength of the second substrate 180. Therefore, the second substrate 180 may be fractured due to the stress. Here, a crack may occur in the unit sacrificial layer 131 positioned at a location corresponding to the one of the first regions R1 of the substrate 110, and the crack may propagate. In this manner, any one of the device parts D alone may undergo the spalling. Although FIGS. 8 and 9 illustrate that any one of the device parts D alone is subject to the spalling, an embodiment of the disclosure is not limited thereto. According to the method of an embodiment of the disclosure, two or more devices parts D may be subject to the spalling.

A structure formed using the semiconductor device manufacturing method according to an embodiment of the disclosure may include a sacrificial layer which defines a crack propagation path. Therefore, a first semiconductor layer may be removed by as much as a required minimum thickness, so that a device may be made thin.

Furthermore, the structure formed using the semiconductor device manufacturing method may include a trench and a metal film for controlling a stress applied to a first epitaxial layer and the first semiconductor layer and progression of a crack. Therefore, since a uniform stress may be applied to a sacrificial layer without damaging a device part, a spalling process may be performed after forming the device part.

In addition, in the structure, only a trench region corresponding to a boundary of device parts have a low strength, and a crack is induced such that the crack occurs only in a first region where the device parts are formed, and thus only a portion of the device parts may be subject to spalling during the spalling process.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method for manufacturing a semiconductor device, the method comprising:
    sequentially stacking a first epitaxial layer, a sacrificial layer, a second epitaxial layer, and a third epitaxial layer on a first substrate;
    forming a trench which penetrates the third epitaxial layer, the second epitaxial layer, and the sacrificial layer;
    forming a structure layer on an upper surface of the third epitaxial layer;
    forming a metal film which covers an inner surface of the trench and the structure layer;
    forming a second substrate which fills the trench and covers the metal film; and
    separating the second epitaxial layer, the third epitaxial layer, and the structure layer from the first epitaxial layer.

2. The method of claim 1, wherein the separating the second epitaxial layer, the third epitaxial layer, and the structure layer comprises:
    providing a stress to the sacrificial layer; and
    separating the second epitaxial layer from the first epitaxial layer,
    wherein propagation of a crack starts, due to the stress, at one end of the sacrificial layer which contacts the metal film,
    wherein the crack progresses along the sacrificial layer.

3. The method of claim 1, wherein the trench is provided in plurality,
    wherein device parts are defined by the trenches,
    wherein each trench comprises a part of the second epitaxial layer, a part of the third epitaxial layer, and a part of the structure layer.

4. The method of claim 3, wherein, during a process of separating the second epitaxial layer, the third epitaxial layer, and the structure layer, only a portion of the device parts is separated.

5. The method of claim 1,
    wherein the sacrificial layer has a lattice constant different from lattice constants of the first epitaxial layer and the second epitaxial layer,
    wherein the sacrificial layer has lattice matching with the first epitaxial layer and the second epitaxial layer at interfaces with the first epitaxial layer and the second epitaxial layer.

6. The method of claim 5,
    wherein the sacrificial layer comprises $In_{0.17}Al_{0.83}N$,
    wherein the first and second epitaxial layers comprise gallium nitride (GaN).

7. The method of claim 1, wherein a bottom surface of the trench has a width larger than that of an upper end of the trench.

8. The method of claim 7, wherein the trench increases in width in a direction from the third epitaxial layer to the sacrificial layer.

9. The method of claim 1,
    wherein the metal film covers a sidewall and a bottom surface of the trench,
    wherein the second substrate is spaced apart from the sidewall and the bottom surface of the trench.

* * * * *